(12) United States Patent
Jarvis et al.

(10) Patent No.: US 8,507,178 B2
(45) Date of Patent: Aug. 13, 2013

(54) POLYCHROMIC SUBSTANCES AND THEIR USE

(75) Inventors: Anthony N Jarvis, Cheshire (GB); Christopher Anthony Wyres, Cheshire (GB)

(73) Assignee: Datalase, Ltd, Cheshire (GB)

( * ) Notice: Subject to any disclaimer, the term of this patent is extended or adjusted under 35 U.S.C. 154(b) by 166 days.

(21) Appl. No.: 13/000,552

(22) PCT Filed: Jul. 2, 2009

(86) PCT No.: PCT/GB2009/050775
§ 371 (c)(1),
(2), (4) Date: Feb. 16, 2011

(87) PCT Pub. No.: WO2010/001171
PCT Pub. Date: Jan. 7, 2010

(65) Prior Publication Data
US 2011/0136934 A1 Jun. 9, 2011

(30) Foreign Application Priority Data

Jul. 3, 2008 (GB) .................................. 0812212.9
Apr. 2, 2009 (GB) .................................. 0905785.2

(51) Int. Cl.
*G03F 7/025* (2006.01)
*G03F 7/00* (2006.01)
*C08F 2/46* (2006.01)
*C08J 3/28* (2006.01)

(52) U.S. Cl.
USPC .................. 430/270.18; 430/346; 430/286.1; 430/287.1; 430/332; 430/338; 430/270.1; 522/158; 585/23; 564/159; 562/579

(58) Field of Classification Search
USPC ............... 430/280.1, 286.1, 287.1; 522/158; 585/23; 564/159; 579/579
See application file for complete search history.

(56) References Cited

U.S. PATENT DOCUMENTS

| | | | |
|---|---|---|---|
| 3,296,321 A * | 1/1967 | Adams et al. ................ | 585/23 |
| 4,242,440 A * | 12/1980 | Yee et al. .................... | 430/346 |
| 4,698,296 A * | 10/1987 | Lewis .......................... | 430/333 |
| 4,705,742 A * | 11/1987 | Lewis .......................... | 430/333 |
| 4,767,797 A * | 8/1988 | Ai et al. ...................... | 522/8 |
| 4,784,934 A * | 11/1988 | Lewis et al. ................. | 430/270.1 |
| 4,957,851 A * | 9/1990 | Tomida et al. .............. | 430/272.1 |
| 4,970,137 A * | 11/1990 | Lewis et al. ................. | 430/296 |
| 5,095,134 A | 3/1992 | Liu | |
| 5,139,926 A * | 8/1992 | Liu .............................. | 430/346 |
| 5,139,927 A * | 8/1992 | Liu et al. ..................... | 430/346 |
| 5,139,928 A * | 8/1992 | Lewis .......................... | 430/346 |

(Continued)

FOREIGN PATENT DOCUMENTS

| | | |
|---|---|---|
| JP | 2006 063045 | 3/2006 |
| KR | 2003 0082277 | 10/2003 |
| WO | WO 92/07298 | 4/1992 |
| WO | WO 2006/018640 | 2/2006 |

OTHER PUBLICATIONS

Barbu et al., "Unsymmetrically substituted aliphatic diacetylenes," *Tetrahedron Letters*, Jul. 1996, pp. 5023-5026, vol. 37, No. 28.
Birman et al., "Kinetic resolution of propargylic alcohols catalyzed by benzotetramisole," *Organic Letters*, Sep. 20, 2006, pp. 4859-4861, vol. 8, No. 21.
Doolittle, "A facile reduction of diynols to ene-yn-ols." *Synthesis*, Sep. 1984, pp. 730-732, vol. 9.

(Continued)

*Primary Examiner* — Sanza McClendon
(74) *Attorney, Agent, or Firm* — Saliwanchik, Lloyd & Eisenschenk

(57) ABSTRACT

The invention relates to use of a diacetylene compound as a color former wherein the diacetylene compound has one of general formulae (I) to (V). The invention also includes methods of imparting color to a material including a compound as defined above, which comprises subjecting the material to irradiation.

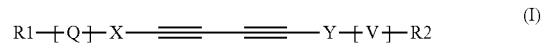

(I)

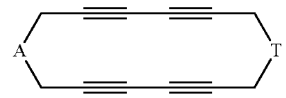

(II)

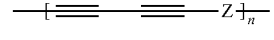

(III)

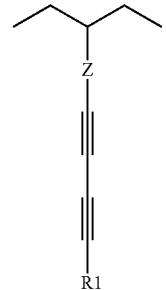

(IV)

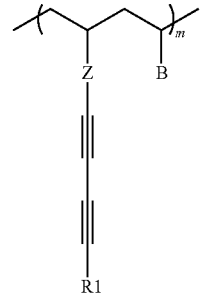

(V)

10 Claims, No Drawings

(56) References Cited

U.S. PATENT DOCUMENTS

| | | | | |
|---|---|---|---|---|
| 5,149,616 A * | 9/1992 | Liu | | 430/346 |
| 5,149,617 A * | 9/1992 | Liu | | 430/346 |
| 5,153,106 A * | 10/1992 | Liu | | 430/340 |
| 5,158,862 A * | 10/1992 | Liu | | 430/333 |
| 5,215,869 A * | 6/1993 | Liu | | 430/333 |
| 5,215,870 A * | 6/1993 | Liu et al. | | 430/333 |
| 5,232,820 A * | 8/1993 | Lewis et al. | | 430/338 |
| 5,468,511 A * | 11/1995 | Zeidler | | 426/614 |
| 6,541,601 B1 * | 4/2003 | Hollingsworth et al. | | 528/310 |
| 6,607,744 B1 * | 8/2003 | Ribi | | 424/439 |
| 7,361,696 B2 * | 4/2008 | Takeda et al. | | 522/2 |
| 7,816,472 B2 * | 10/2010 | Cernohous et al. | | 526/285 |
| 7,897,320 B2 * | 3/2011 | Rogers et al. | | 430/270.1 |
| 8,083,973 B2 * | 12/2011 | Jarvis | | 252/586 |
| 8,173,253 B2 * | 5/2012 | Green et al. | | 428/354 |
| 8,211,620 B2 * | 7/2012 | Rogers et al. | | 430/270.1 |
| 2003/0103905 A1 | 6/2003 | Ribi | | |

OTHER PUBLICATIONS

Tao et al., "Nonenzymatic kinetic resolution of propargylic alcohols by a planar-chiral DMAP derivative: crystallographic characterization of the acylated catalyst," *Journal of the American Chemical Society*, May 1999, pp. 5091-5092, vol. 121, No. 21.

* cited by examiner

POLYCHROMIC SUBSTANCES AND THEIR USE

CROSS REFERENCE TO A RELATED APPLICATION

This application is a National Stage Application of International Application Number PCT/GB2009/050775, filed Jul. 2, 2009; which claims priority to Great Britain Applications No. 0905785.2, filed Apr. 2, 2009 and 0812212.9, filed Jul. 3, 2008; all of which are incorporated herein by reference in their entirety.

FIELD OF INVENTION

This invention relates to novel uses of diacetylenes as colour formers.

BACKGROUND TO THE INVENTION

Polydiacetylenes may be coloured. Further, for example, it is known that the blue form of poly(10,12-pentacosadiynoic acid) is transformed to the red form in response to various stimuli, e.g. temperature, pH and mechanical stress. This has been utilised to produce colorimetric chemosensors or biosensors, where the perturbation arises due to binding of a given analyte to a receptor covalently attached as a pendant group to the polydiacetylene backbone. Preference is generally for polydiacetylene structures such a liposomes or Langmuir-Schaefer films.

Diacetylenes can be polymerised by irradiation with UV light. The use of a UV laser to cause the marking of a diacetylene has been described in, for example, U.S. Pat. No. 5,149,617. That document also describes how the polydiacetylene can undergo a thermochromic change, e.g. from magenta to red. Thus, a single UV irradiation step is followed by a separate, heating step.

U.S. Pat. No. 4,705,742A discloses differential exposure of a conjugated polyacetylenic compound, to develop a range of colours in a layer on a substrate. The irradiation is with an electron beam, at a wavelength below 200 nm.

WO2006/018640 is based in part on an application of how the effects reported in U.S. Pat. No. 4,705,742A can be controlled, and utilised to achieve multi-colour printing. The publication discloses a method of forming an image on a substrate, which comprises applying to the substrate a combination of a diacetylene and a photoacid or photobase. The diacetylene is polymerised by radiation. 10,12-pentacosadiynoic acid is used in the Examples of this application.

SUMMARY OF INVENTION

A diacetylene compound which will undergo a colour change upon irradiation, and which has one of the following general structures:

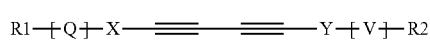
(I)

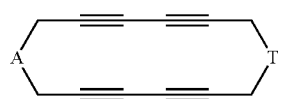
(II)

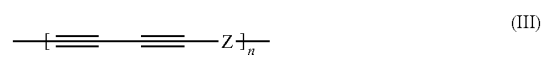
(III)

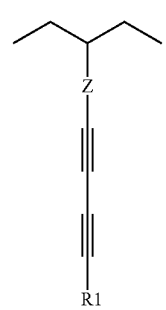
(IV)

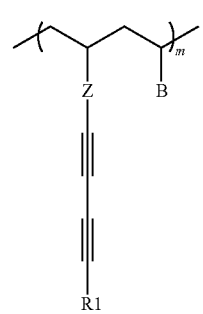
(V)

wherein,

X and Y are divalent straight-chain or branched alkylene groups ($-CH_2-$)$_n$ wherein n=0 to 24, or a divalent phenylene group ($-C_6H_4-$)$_n$ wherein n=0 to 1 or a combination of both alkylene and phenylene, and wherein in formula (I) X and/or Y are substituted with a functional group in the $\alpha$, $\beta$ or $\gamma$ position with respect to the diacetylene group:

Q and V are optional and, if present, are divalent bridging groups such as $-S-$, $-O-$, $-NHR'-$, amide, ester, thioester, carbonyl or a carbamate group; wherein R' is hydrogen or alkyl;

R1 and R2 are H or alkyl;

A and T are divalent groups that can either be an alkylene or phenylene type such as X or Y, or a bridging type such as Q or V, or a combination of both types, X or Y that additionally comprises a Q or V group;

Z is a divalent group such as X or Q or a combination of both, X may additionally comprise a Q group, or Z can be absent;

n and m are each, independently 2 to 20,000,000; and

B is $-X+Q-]R1$, wherein X, Q and R1 are as defined above.

According to a second aspect of the invention, a method of imparting colour to a material using a compound described above, comprises subjecting the material to irradiation. The compound can be within or on the surface of a substrate.

DETAILED DESCRIPTION OF THE INVENTION

The diacetylene compounds of the present invention fall into four categories:
1. Discrete molecular diacetylenes
2. Ring system diacetylenes
3. Polymer backbones diacetylenes
4. Polymer sidechain diacetylenes The term alkylene as used above includes straight chain and branched systems and it may also contain other functional groups known in organic chemistry such as alcohol, amine, carboxylic acid groups and the like.

The term phenylene as used above is a system comprising at least one aromatic ring with the general formula —$C_6H_4$—. However, this does not preclude additional functionalisation of said ring system.

The bridging group can be any suitable group taken from organic chemistry and examples include: O, S, NHR' (where R' is hydrogen or alkyl), amide, ester or thioester groups, carbonyl or carbamate groups. Q and V may comprise the unfunctionalised divalent bridging group parent such as amine, alcohol, thiol or carboxylic acid. Both Q and V may be present, or alternatively, just Q. The diacetylene may be symmetrical or unsymmetrical.

Where R1 and R2 in the above compounds are alkyl groups, they can be straight chain or branched. They can additionally include other functional groups known in organic chemistry such as alcohol, amine, carboxylic acid groups and the like and aromatic ring systems. Unsaturated groups may be present, such as alkene and alkyne groups.

Groups R1, R2, Q, V, X and Y may, in one embodiment of the invention, comprise ionic groups, which can be anionic or cationic. Examples include sulphonate groups (—$SO_3$—) and ammonium groups.

Preferred colour forming diacetylenes are those that are capable of forming at least two distinct colours selected from blue, red, green, cyan, magenta and yellow.

Particularly preferred diacetylene compounds for use in this invention are those which give rise to electrical conductivity as well as colour on polymerisation.

Either or both of groups X and Y are substituted in the α, β or γ position with respect to the diacetylene with a functional group. The functional group may, for instance, be hydroxyl, amine and functionalised amino, alkoxy, acyl, alkyl, alkylene, alkyne, halogeno, thiol and the like. In one embodiment, the compound has an α-hydroxyl group, as shown below.

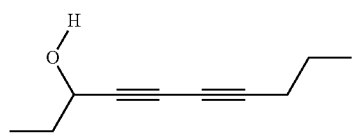

A diacetylene compound that is 'activatable', i.e. has a first solid form that is relatively unreactive to light, but upon 'activation' is transformed into a second form that is relatively reactive to light and is thus capable of undergoing a colour change reaction to create a visible image, has particular utility in the present invention. Without being limited by theory the activation could be a re-crystallisation, crystal form modification, co-crystal combination or melting/re-solidification process.

Particularly preferred diacetylenes are those that after initial melting and re-solidification activation are colourless but become blue on exposure to light, particularly UV light. The most preferred diacetylenes compounds are carboxylic acids and derivatives thereof where:

either R and/or R' comprises a COX group and is α, β or γ substituted with respect to the diacetylene group.

X is: —NHY, —OY, —SY, where Y is H or any group comprising at least one carbon atom.

Particularly preferred still are derivatives in which the carboxylic acid group has been functionalised into an amide, ester or thioester. These can be easily made by reacting a diacetylene carboxylic acid with a chlorinating agent such as oxalyl chloride and then reacting the diacetylene acid chloride with a nucleophilic compound such as an amine, alcohol or thiol.

The activatable diacetylene is generally used together with a NIR light absorbing agent, which is a compound that absorbs light in the wavelength range 700 to 2500 nm.

A NIR light source, such as a NIR fibre laser, is used to heat the composition comprising the diacetylene which may be in the form of a coating only in the areas where the image is required. A UV light source, such as a germicidal lamp, is then used to flood the coating with UV light. However, the diacetylene compound only undergoes a colour change reaction to create an image in the areas which were initially exposed to NIR light. The areas of the coating unexposed to NIR light undergo a negligible colour change reaction, remain essentially colourless, and are stable to background radiation. A thermal print head may be used to initiate the heat-based pre-activation step.

Specific examples of NIR light absorbing agents include:
i. Organic NIR absorbing agents
ii. NIR absorbing 'conductive' polymers
iii. Inorganic NIR absorbing agents
iv. Non-stoichiometric inorganic absorbing agents.

Particularly preferred NIR absorbing agents are those that have essentially no absorbance in the visible region of the spectrum (400 to 700 nm) and thus give rise to coatings that appear visibly colourless.

Organic NIR absorbing agents are known as NIR dyes/pigments. Examples include but are not limited to: families of metallo-porphyrins, metallo-thiolenes and polythiolenes, metallo-phthalocyanines, aza-variants of these, annellated variants of these, pyrylium salts, squaryliums, croconiums, amminiums, diimoniums, cyanines and indolenine cyanines.

Examples of organic compounds that can be used in the present invention are taught in U.S. Pat. No. 6,911,262, and are given in Developments in the Chemistry and Technology of Organic dyes, J Griffiths (ed), Oxford: Blackwell Scientific, 1984, and Infrared Absorbing Dyes, M Matsuoka (ed), New York: Plenum Press, 1990. Further examples of the NIR dyes or pigments of the present invention can be found in the Epolight™ series supplied by Epolin, Newark, N.J., USA; the ADS series supplied by American Dye Source Inc, Quebec, Canada; the SDA and SDB series supplied by H W Sands, Jupiter, Fla., USA; the Lumogen™ series supplied by BASF, Germany, particularly Lumogen™ IR765 and IR788; and the Pro-Jet™ series of dyes supplied by FujiFilm Imaging Colorants, Blackley, Manchester, UK, particularly Pro-Jet™ 830NP, 900NP, 825LDI and 830LDI. Further examples are taught in WO08/050,153.

Examples of NIR absorbing 'conductive' polymers include PEDOT such as, the product Baytron® P supplied by H C Starck. Further examples are taught in WO05/12442.

Examples of inorganic NIR absorbing agents include copper (II) salts. Copper (II) hydroxyl phosphate (CHP) is particularly preferred. Further examples are taught in WO05/068207.

Examples of non-stoichiometric inorganic absorbing agents include reduced indium tin oxide, reduced antimony tin oxide and reduced titanium nitrate. Further examples are taught in WO05/095516. Reduced indium tin oxide is particularly preferred in combination with a 1550 nm to 2500 nm laser.

It is particularly preferred if the absorption profile of the NIR absorbing agent approximately matches the emission wavelength(s) of the NIR light source employed.

Other light absorbing agents that can be used, instead of the NIR absorbing agent include UV (200 to 400 nm), visible (400 to 700 nm) and mid-infrared (~10.6 microns) light absorbing agents. Examples includes dyes/pigments, UV absorbers and Iriodin type agents.

The compounds of the present invention can be used to impart colour to thermoplastics. Examples of the thermoplastics in which the diacetylene compounds of the present invention can be incorporated into are: arylonitrile-butadiene-styrene (ABS), acrylics, celluloids, cellulose acetate, ethylene-vinyl Acetate (EVA), ethylene-vinyl alcohol (EVAL), fluoroplastics (PTFEs, including FEP, PFA, CTFE, ECTFE, ETFE), ionomers, Kydex (a acrylic/PVC alloy), liquid crystal polymers (LCP), polyacetals (POM or acetal), polyacrylates (acrylic), polyacrylonitrile (PAN or acrylonitrile), polyamides (PA or Nylon), polyamide-imides (PAI), polyaryl ether ketones (PAEK or Ketone), polybutadienes (PBD), polybutylenes (PB), polybutylene terephthalate (PBT), polyethylene terephthalate (PET), polycyclohexylene dimethylene terephthalate (PCT), polycarbonate (PC), polyhydroxyalkanoates (PHAs), polyketones (PK), polyesters, polyethylene (PE) including low density (LDPE) and high density (HDPE) versions, polyether ether ketones (PEEK), polyetherimides (PEI), polyethersulfones (PES), polyethylene chlorinates (PEC), polyimides (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfones (PSU), polyvinyl chloride (PVC), polyvinylidene chloride (PVDC) and Spectralon. Particularly preferred are thermoplastics which can be moulded into parts such as packaging for example bottles, closures and caps; or films and non-wovens, or parts suitable for use in FMCG goods and the like.

The compounds of the present invention can also be included into surface coating formulations such as inks or paints. The coating then be applied to a substrate and irradiated to impart colour to the substrate. The substrate can be paper, card, glass, plastic, film, metal, wood, textiles and the like.

The diacetylene can be directly embedded into the substrate as well as coated on to its surface. For example in paper adding the colour change diacetylene to the pulp during manufacturing gives rise to a substrate that can be coloured/images without the need for surface coatings.

The diacetylene can be used in any application where light activated colour forming is required.

The thermoplastic, surface coating or substrate to which the diacetylene has been applied can further comprise additional substances. Example include: light absorbers with a absorbance maximum in the range 200 nm to 20 microns, including UV (beznthiazoles), visible, NIR (conductive polymers, copper salrs (such as CHP), non-stoichiometrics such as r-ITO and organic NIR dyes and pigment, and mid-IR absorbers such as Iriodin types; traditional dyes and pigments; whitening agents; optical brighteners; rheology modifiers; binders; free radical scavengers, colour forming agents which can be inorganic such as metal oxyanion, e.g. ammonium octamolybdate, or organic such as leuco dyes; charrables such as sugars and polysaccharides e.g. sucrose; pH modification agents such as acids or alkalis, in fact any substance known to those skilled in the art of thermoplastics, surface coatings and substrates.

EXAMPLES

1. A Cadiot-Chodkiewicz coupling reaction was performed on 1,9-decadiyne to yield

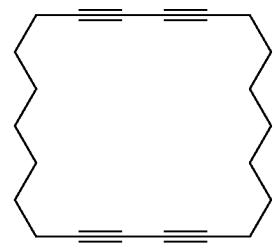 [SMILES: C1#CCCCCCCCC#CC#CCCCCCCCC#C1]

2. 10,12-Pentacosadiynoic acid was converted into its acid chloride form and reacted with N-(3-aminopropyl)methacrylamide hydrochloride to yield:

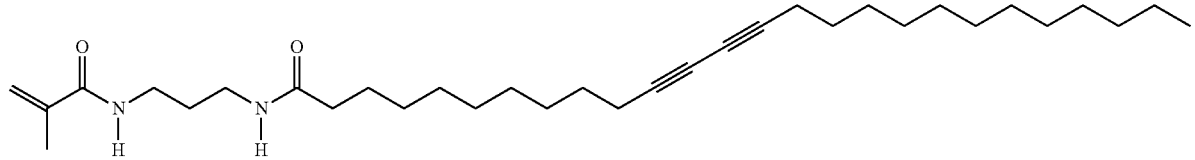 [SMILES: C=C(C)C(=O)NCCCNC(=O)CCCCCCCCCC#CC#CCCCCCCCCCCCC]

Polymerisation of the methacrylamide group yields a polymer species in which the diacetylene is present in pendant side groups.

3. 10,12-Pentacosadiynoic acid was converted into its acid chloride form and reacted with poly(allylamine) to yield:
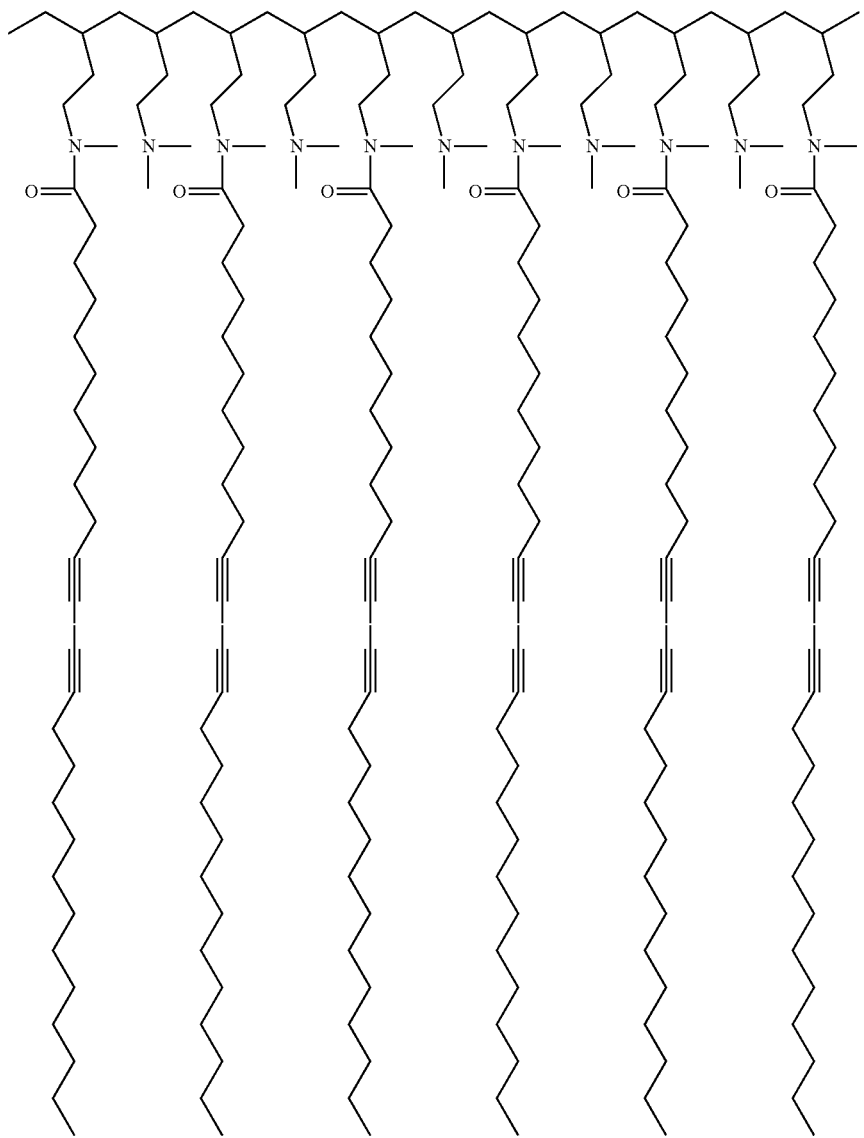 [SMILES: CCCCCCCCCCCCC#CC#CCCCCCCCCCC(=O)N(C)CCC(C)CC(CCN(C)C)CC(CCN(C)C(=O)CCCCCCCCCC#CC#CCCCCCCCCCCCC)CC(CCN(C)C)CC(CCN(C)C(=O)CCCCCCCCCC#CC#CCCCCCCCCCCCC)CC(CCN(C)C)CC(CCN(C)C(=O)CCCCCCCCCC#CC#CCCCCCCCCCCCC)CC(CCN(C)C)CC(CCN(C)C(=O)CCCCCCCCCC#CC#CCCCCCCCCCCCC)CC(CCN(C)C)CC(CC)CCN(C)C(=O)CCCCCCCCCC#CC#CCCCCCCCCCCCC]
in which the diacetylene is present in pendant side groups.
4. 10-Undecynoic acid was coupled on to 1-octyn-3-ol yield:
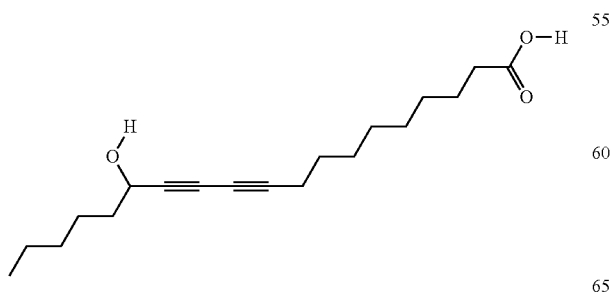

5. 10,12-Docosadiyndioic acid was converted into its acid chloride form, which was reacted with 1,6-hexamethylenediamine to yield the following polymer:—

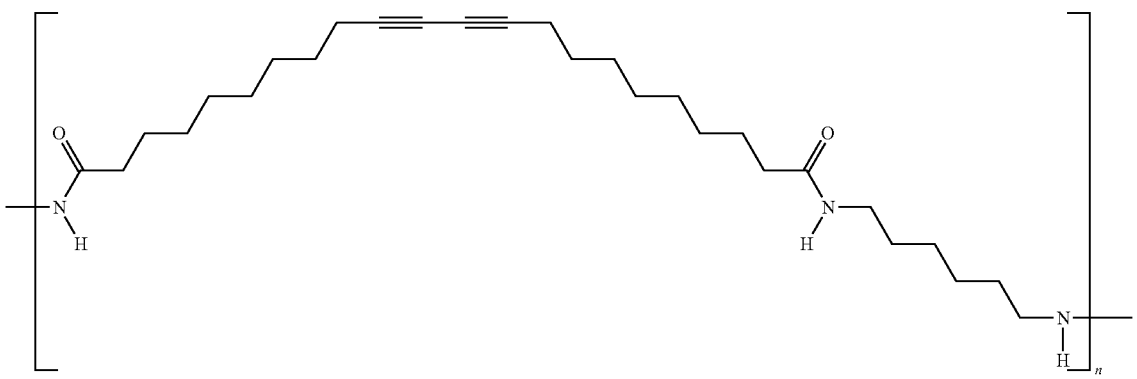

The invention claimed is:

1. A diacetylene compound of formula (I):

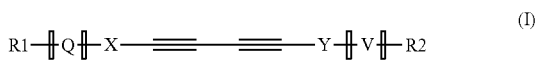

(I)

wherein one of X and Y is a divalent straight-chain or branched alkylene group of up to 24 C atoms, a divalent phenylene group, or a combination of both alkylene and phenylene, and the other of X and Y is a bond or a divalent straight-chain or branched alkylene group of up to 24 C atoms, a divalent phenylene group, or a combination of both alkylene and phenylene;

wherein X and/or Y are substituted with a hydroxyl group in the α position with respect to the diacetylene group;

wherein V is a divalent bridging group selected from —S—, —O—, —NHR'—, amide, ester, thioester, carbonyl, and a carbamate group;

wherein R' is hydrogen or alkyl;

wherein Q is a bond or a divalent bridging group selected from —S—, —O—, —NHR'—, amide, ester, thioester, carbonyl, and a carbamate group; wherein R' is hydrogen or alkyl;

wherein R1 is H or alkyl; and wherein R2 is alkyl.

2. A method of imparting colour to a material, wherein the material comprises the compound according to claim 1, wherein the method comprises subjecting the material to irradiation.

3. The method according to claim 2, wherein the material is a thermoplastic resin.

4. The method according to claim 2, wherein the material is a surface coating formulation that has been applied to a substrate.

5. The method according to claim 2, wherein the material is embedded into a substrate.

6. The method according to claim 2, wherein the irradiation is ultra-violet radiation.

7. The method according to claim 2, wherein the irradiation is ultra-violet and then infrared, optionally followed by further irradiation.

8. The method according to claim 2, wherein the irradiation is infrared and then ultra-violet, optionally followed by further irradiation.

9. The method according to claim 2, wherein the irradiation is non-coherent or laser radiation.

10. The method according to claim 2, wherein the material becomes electrically conductive when subjected to irradiation.

* * * * *

UNITED STATES PATENT AND TRADEMARK OFFICE
CERTIFICATE OF CORRECTION

PATENT NO. : 8,507,178 B2  Page 1 of 1
APPLICATION NO. : 13/000552
DATED : August 13, 2013
INVENTOR(S) : Anthony Nicholas Jarvis et al.

It is certified that error appears in the above-identified patent and that said Letters Patent is hereby corrected as shown below:

In the Claims

Column 9,

Line 27, " R1─║Q╫X═══════Y╫V║─R2 ,, should read -- R1─{Q}─X═══════Y{V}─R2 --.

Signed and Sealed this
Twenty-second Day of October, 2013

Teresa Stanek Rea
*Deputy Director of the United States Patent and Trademark Office*